US009064569B1

(12) United States Patent
Gorobets et al.

(10) Patent No.: US 9,064,569 B1
(45) Date of Patent: Jun. 23, 2015

(54) MEMORY CONTROLLER WITH RESISTIVE RANDOM ACCESS MEMORY (RERAM)

(71) Applicant: SANDISK TECHNOLOGIES INC., Plano, TX (US)

(72) Inventors: Sergey Anatolievich Gorobets, Edinburgh (GB); Aaron Keith Olbrich, Morgan Hill, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/323,590

(22) Filed: Jul. 3, 2014

(51) Int. Cl.
*G11C 7/00* (2006.01)
*G11C 14/00* (2006.01)

(52) U.S. Cl.
CPC .......... *G11C 14/0045* (2013.01); *G11C 14/009* (2013.01)

(58) Field of Classification Search
CPC .................. G11C 13/0069; G11C 16/0483
USPC ............................................. 365/185.03, 148
See application file for complete search history.

(56) References Cited

U.S. PATENT DOCUMENTS

| 7,495,984 | B2 | 2/2009 | Kim et al. | |
|---|---|---|---|---|
| 8,068,361 | B2 * | 11/2011 | Kang et al. | 365/185.03 |
| 8,295,084 | B2 * | 10/2012 | Lee | 365/185.03 |
| 8,738,994 | B2 | 5/2014 | Cho et al. | |
| 8,811,060 | B2 * | 8/2014 | Burr et al. | 365/148 |
| 2010/0191896 | A1 | 7/2010 | Yang et al. | |
| 2010/0254188 | A1 * | 10/2010 | Ohsuk et al. | 365/185.03 |
| 2012/0246392 | A1 | 9/2012 | Cheon | |
| 2013/0208542 | A1 | 8/2013 | Park | |
| 2013/0279249 | A1 | 10/2013 | Yun et al. | |
| 2014/0068157 | A1 | 3/2014 | Makuni et al. | |
| 2014/0136767 | A1 | 5/2014 | Lee et al. | |

* cited by examiner

*Primary Examiner* — Michael Tran
(74) *Attorney, Agent, or Firm* — Toler Law Group, PC (57) ABSTRACT

A method includes, in a data storage device that includes a non-volatile memory and a controller coupled to a non-volatile memory, the controller including a bus and a processor coupled to the bus, accessing a volatile memory included in the controller via a first interface. The volatile memory is coupled to the bus via the first interface. The data storage device further includes a resistive random access memory (ReRAM) having a second interface. The method also includes storing data at the ReRAM via the second interface. The ReRAM is coupled to the bus via the second interface. The controller is configured to store user data at the non-volatile memory via a dedicated controller-to-non-volatile memory interface.

25 Claims, 7 Drawing Sheets

FIG. 7

MEMORY CONTROLLER WITH RESISTIVE RANDOM ACCESS MEMORY (RERAM)

FIELD OF THE DISCLOSURE

The present disclosure is generally related to a memory control with resistive random access memory (ReRAM).

BACKGROUND

Non-volatile data storage devices, such as embedded memory devices (e.g., embedded MultiMedia Card (eMMC) devices) and removable memory devices (e.g., removable universal serial bus (USB) flash memory devices and other removable storage cards), have allowed for increased portability of data and software applications. Users of non-volatile data storage devices increasingly rely on the non-volatile storage devices to store and provide rapid access to a large amount of data.

A non-volatile data storage device may include on-board capacitors to complete programming and/or to save data in the case of a loss of power. However, the on-board capacitors may add additional costs to manufacturing the non-volatile data storage device and may increase a size of the data storage device based on a physical size of the capacitors.

SUMMARY

A data storage device includes a controller coupled to a non-volatile memory and further coupled to a resistive random access memory (ReRAM). For example, the ReRAM may be included in the controller (e.g., on the same die as the controller) or coupled to the controller (e.g., on a separate die as the controller). The controller may include a processor or other control logic that may use the ReRAM to store data that may be maintained during a low-power event, such as a power off of the data storage device. For example, the processor may utilize the ReRAM to store a copy of user data to be stored at the non-volatile memory, metadata associated with the user data, logical-to-physical mapping data, block mapping data, processor variables, and/or processor context data.

In accordance with described techniques, the processor may store data at the ReRAM prior to a low-power event, such as a loss of power or a power shutdown. The ReRAM may maintain the data at least during a duration of the low-power event. After a power restoration event, the processor may retrieve the data from the ReRAM. Accordingly, the ReRAM may provide a high-efficiency solution to protect controller data and/or data being stored to the non-volatile memory in the event of a loss of power.

DETAILED DESCRIPTION

Particular embodiments of the present disclosure are described with reference to the drawings. In the description, common features are designated by common reference numbers throughout the drawings.

Figure 1:
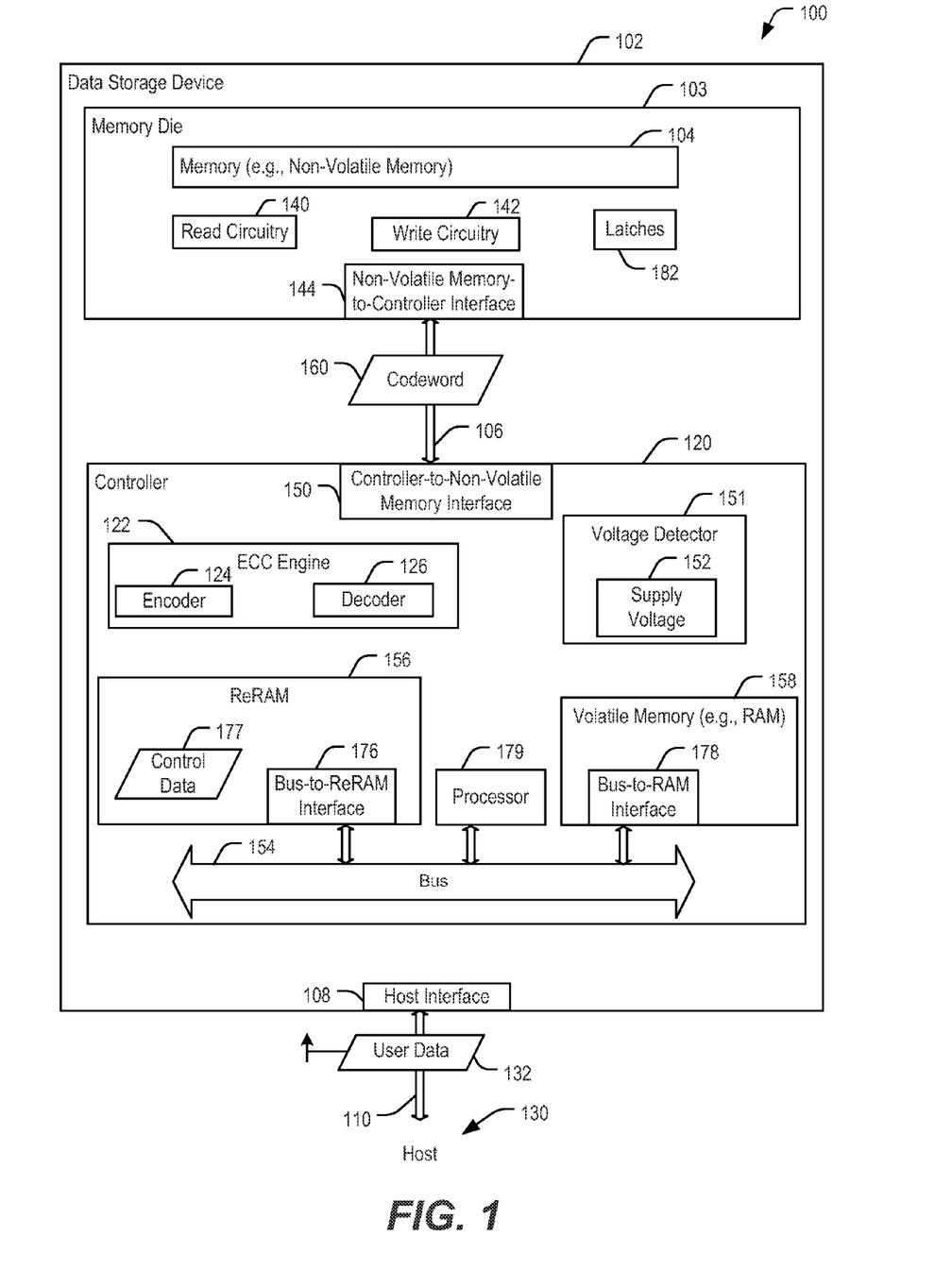
FIG. 1 is a block diagram of a particular illustrative embodiment of a system including a data storage device having a memory controller with resistive random access memory (ReRAM)

FIG. 1 is a block diagram of a particular illustrative embodiment of a system 100 including a data storage device 102 and a host device 130. The data storage device 102 includes a controller 120 (e.g., a memory controller) coupled to a memory device including one or more memory dies, such as a representative memory die 103. The memory die 103 may include a memory 104 (e.g., a non-volatile memory, such as a flash memory) and the controller 120 may include a resistive random access memory (ReRAM) 156 and a volatile memory 158.

The data storage device 102 may be embedded within the host device 130, such as in accordance with an embedded MultiMedia Card (eMMC®) (trademark of Joint Electron Devices Engineering Council (JEDEC) Solid State Technology Association, Arlington, Va.) configuration. Alternatively, the data storage device 102 may be removable from (i.e., "removably" coupled to) the host device 130. For example, the data storage device 102 may be removably coupled to the host device 130 in accordance with a removable universal serial bus (USB) configuration. In some embodiments, the data storage device 102 may include or correspond to a solid state drive (SSD), which may be used as an embedded storage drive, an enterprise storage drive (ESD), or a cloud storage drive (CSD), as illustrative, non-limiting examples.

The data storage device 102 may be coupled to the host device 130 via a communication path 110, such as a wired communication path and/or a wireless communication path. For example, the data storage device 102 may include an interface 108 (e.g., a host interface) that enables communication (via the communication path 110) between the data storage device 102 and the host device 130, such as when the interface 108 is coupled to the host device 130.

The host device 130 may include a processor and a memory. The memory may be configured to store data and/or instructions that may be executable by the processor. The memory may be a single memory or may include one or more memories, such as one or more non-volatile memories (e.g., a ReRAM, a flash, or a combination thereof), one or more volatile memories, or a combination thereof. The host device 130 may issue one or more commands to the data storage device 102, such as one or more requests to read data from or write data to the memory 104 of the data storage device 102. For example, the host device 130 may send data, such as user data 132, to be written to the memory 104 of the data storage device 102.

The data storage device 102 includes a controller 120 coupled to the memory die 103. The controller 120 may be coupled to the memory die 103 via a bus 106, an interface (e.g., a controller-to-non-volatile memory interface 150), another structure, or a combination thereof. The memory die 103 may be separate from the controller 120 and coupled to the controller 120 (e.g., via the bus 106). For example, the controller 120 may be included in a particular die that is distinct from the memory die 103. However, in other implementations, the memory die 103 may include the controller 120.

The memory die 103 may be coupled to the controller 120 via the bus 106, an interface (e.g., a non-volatile memory-to-controller interface 144), another structure, or a combination thereof. For example, the memory die 103 may include the non-volatile memory-to-controller interface 144 that is configured to route data to and from the controller 120. To illustrate, the non-volatile memory-to-controller interface 144 may route the data received from the controller 120 to the memory 104 via the latches 182 and may route data received from the memory 104 (via the latches 182) to the controller 120.

The memory 104 may include a non-volatile memory (e.g., a NAND flash memory) that is in a two dimensional (2D) memory configuration or a three dimensional (3D) memory configuration. The memory 104 may include a group of storage elements. The group of storage elements may be arranged in one or more pages, one or more wordlines, and/or one or more blocks. For example, each of multiple word lines may include one or more pages (e.g., physical pages). Additionally, each of the multiple word lines may be included in a block of the memory 104. Each storage element of the group of storage elements may be configured as a single-level cell (SLC) or a multi-level cell (MLC) cell. The memory 104 may store data, such as the user data 132 or encoded user data, such as a codeword 160, as described further herein. The memory 104 (e.g., the non-volatile memory, such as a flash memory) may be configured to use the set of latches 182 to access data communicated via the bus 106 and to route the data via the bus 106.

The memory die 103 may further include read circuitry 140 and write circuitry 142. Although illustrated as separate components, the read circuitry 140 and the write circuitry 142 may be included in a single component of the memory die 103. The read circuitry 140 and the write circuitry 142 may be configured to enable operations of reading data from the memory 104 and writing data to the memory 104, respectively. For example, the write circuitry 142 may be configured to write data from the latches 182 to the memory 104 and the read circuitry 140 may be configured to read the data from the memory 104 to the latches 182.

The controller 120 may be configured to receive data and commands (e.g., instructions) from the host device 130 and may access the memory 104 based on the received commands. The controller 120 may send one or more write requests to the memory 104 to store the data to a specified address of the memory 104. The write request may specify a physical address of a portion of the memory 104 (e.g., a physical address of a word line of the memory 104) that is to store the data. For example, the controller 120 may be configured to send one or more write requests to store data, such as the user data 132, at the memory 104 via the dedicated controller-to-non-volatile memory interface 150. The controller 120 may be configured to send a read request to the memory 104 to access data from a specified address of the memory 104. To illustrate, the controller 120 may send a read request to access the data stored in the memory 104. The read request may specify the physical address of a portion of the memory 104 (e.g., a physical address of a word line storing the data).

The controller 120 may include the ReRAM 156, the volatile memory 158 (e.g., a random access memory (RAM)), a processor 179 (e.g., control logic), a bus 154, an error correction code (ECC) engine 122, and a voltage detector 151. The ReRAM 156, the volatile memory 158, the processor 179, the ECC engine 122, the voltage detector 151, or a combination thereof may be coupled (e.g., directly coupled) to the bus 154 of the controller 120. For example, the bus 154 may be an internal bus included in the controller 120.

The voltage detector 151 may be configured to monitor a supply voltage 152 of the data storage device 102 (e.g., of the controller 120). For example, the voltage detector 151 may be configured to detect a low-power event, such as a power off event, and to detect a power restoration event.

The ReRAM 156 may be configured to store control data 177 generated by the controller 120, such as data generated by the processor 179 and/or the ECC engine 122. The control data 177 may include logical-to-physical mapping data, block mapping data, processor variables, processor context data, or a combination thereof, as illustrative, non-limiting examples. Alternatively, or in addition, the ReRAM 156 may be configured to store the user data 132 that is to be written to the memory 104. In addition to the user data 132, the ReRAM 156 may store metadata associated with the user data 132, an address (e.g., location information) associated with an address of the memory where the user data 132 is to be stored, as illustrative, non-limiting examples. In some embodiments, the processor 179 may access and generate a copy of at least a portion of the volatile memory 158 and the copy may be stored at the ReRAM 156 as the control data 177.

The ReRAM 156 may include an interface, such as a dedicated bus-to-ReRAM interface 176, and the volatile memory 158 may include another interface, such as a dedicated bus-to-volatile memory interface 178. Each of the ReRAM 156 and the volatile memory 158 may be coupled to the bus 154. For example, the ReRAM 156 may be coupled to the bus 154 via the dedicated bus-to-ReRAM interface 176 and the volatile memory 158 may be coupled to the bus 154 via the dedicated bus-to-volatile memory interface 178.

The bus-to-ReRAM interface 176 may include a bit accessible interface and/or a block accessible interface. Additionally, the bus-to-ReRAM interface 176 may include a parallel interface and/or a serial interface. Alternatively, the bus-to-ReRAM interface 176 may include a hybrid interface where bits (or blocks) of the ReRAM may be accessed randomly in one operating mode and in parallel in another operating mode.

The processor 179 may be configured to perform and/or initiate one or more operations associated with the data storage device 102. For example, processor 179 may access (e.g., read from and/or write to) the memory die 103, communicate (e.g., send and/or receive) data to the host device 130, and access data (e.g., read from and/or write to) one or more components included in the controller 120. To illustrate, the processor 179 may be configured to initiate access to the volatile memory 158, to initiate access to the ReRAM 156, to initiate access to the memory 104, or a combination thereof. For example, the processor 179 may be configured to access the volatile memory 158 via the dedicated bus-to-volatile memory interface 178. The processor 179 may also be configured to store data, such as the control data 177 and/or the user data 132, at the ReRAM 156 via the dedicated bus-to-ReRAM interface 176. By storing the data at the ReRAM 156, the data may be preserved during a power off event, such as a sudden loss of power or a controlled shutdown of the data storage device 102.

Additionally, the data storage device 102 may include an error correction code (ECC) engine 122. The ECC engine 122 may be configured to receive data, such as the user data 132, and to generate one or more error correction code (ECC) codewords (e.g., including a data portion and a parity portion) based on the data. For example, the ECC engine 122 may receive the user data 132 and may generate the codeword 160. To illustrate, the ECC engine 122 may include an encoder 124 configured to encode the data using an ECC encoding technique. The ECC engine 122 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

The ECC engine 122 may include a decoder 126 configured to decode data read from the memory 104 to detect and correct bit errors that may be present in the data. For example, the ECC engine 122 may correct a number of bit errors up to an error correction capability of an ECC technique used by the ECC engine 122. A number of errors identified by the ECC engine 122 may be tracked by the controller 120, such as by the ECC engine 122. For example, based on the number of errors, the ECC engine 122 may determine a bit error rate (BER) associated with the memory 104.

During operation, the controller 120 (e.g., the processor 179) may receive the user data 132 from the host device 130 be stored at the memory 104. The controller 120 (e.g., the processor 179) may send the user data 132 (or an encoded version of the user data 132, such as the codeword 160) to the memory die 103 to be stored at the memory 104. For example, the controller 120 (the processor 179) may send the user data 132 to the memory 104 via the dedicated controller-to-non-volatile memory interface 150. Additionally, the controller 120 (e.g., the processor 179) may generate a copy of the user data 132 and store the copy at the ReRAM 156 and/or at the volatile memory 158.

In some embodiments, the controller 120 (e.g., the processor 179) may be configured to update a logical-to-physical mapping table stored at the ReRAM 156. For example, when the controller 120 (e.g., the processor 179) sends the user data 132 to be stored at a location of the memory 104, the processor 179 may generate the control data 177 to update the logical-to-physical mapping table and may send the control data 177 to the ReRAM 156 via the dedicated bus-to-ReRAM interface 176.

In other embodiments, the processor 179 may be configured to read the control data 177 from the ReRAM 156 in response to power restoration event (e.g., a power on event), such as a power on event that occurs after a low-power event (e.g., a power off event). The control data 177 may have been stored at the ReRAM 156 prior to the low-power event and may have been maintained at the ReRAM 156 during a time period beginning at a first time of the low-power event and ending at a second time of the power restoration event. After the power restoration event, the processor 179 may retrieve the control data 177, such as logical-to-physical mapping data, block mapping data, processor variables, processor context data, or a combination thereof, from the ReRAM 156 via the dedicated bus-to-ReRAM interface 176.

In some embodiments, the controller 120 may include the ReRAM 156 and may include or be coupled to another memory, such as the volatile memory 158. Although the other memory (e.g., the volatile memory 158) is illustrated as a single memory component, in other embodiments, the other memory may include multiple distinct memory components and/or multiple different types of memory components. For example, in addition to the ReRAM 156, the controller 120 may include one or more volatile memories and one or more non-volatile memories. To illustrate, the controller 120 (e.g., the processor 179) may also include or be coupled to (via the bus 154) one or more other memories, such as a dynamic random access memory (DRAM).

The controller 120 (e.g., the processor 179, the ECC engine 122, the voltage detector 151, and/or the volatile memory 158) and the ReRAM 156 may be included in same die. Alternatively, the controller 120 (e.g., the processor 179, the ECC engine 122, the voltage detector 151, and/or the volatile memory 158) and the ReRAM 156 may be on separate dies (e.g., different dies). When the controller 120 and the ReRAM 156 are on separate dies, the separate dies may be included in the same package. For example, the controller 120 (e.g., the processor 179, the ECC engine 122, the voltage detector 151, and/or the volatile memory 158) may be included in a first die of a package and the ReRAM 156 may be included in a second die (distinct from the first die) of the package. Additionally, the volatile memory 158 (or one or more other memories) may be included in the same die or the same package as the controller 120 (e.g., the processor 179, the ECC engine 122, and/or the voltage detector 151), the ReRAM 156, or a combination thereof.

Although not illustrated, the controller 120 may include read circuitry and/or write circuitry to enable data to be written to and read from the ReRAM 156 and/or the volatile memory 158. In some embodiments, the ReRAM 156 and/or the volatile memory 158 may include dedicated read circuitry, dedicated write circuitry, or a combination thereof.

By sending data to the ReRAM 156, the controller 120 may maintain data during a low-power event, such as a power off event. Thus, the data storage device 102 may maintain the data in the event of a power loss without using capacitors to extend a write capability during a power loss, which may reduce a cost of manufacturing the data storage device 102 by omitting the capacitors and may reduce a size of the data storage device 102 that would otherwise be occupied by a physical size of the capacitors.

Figure 2:
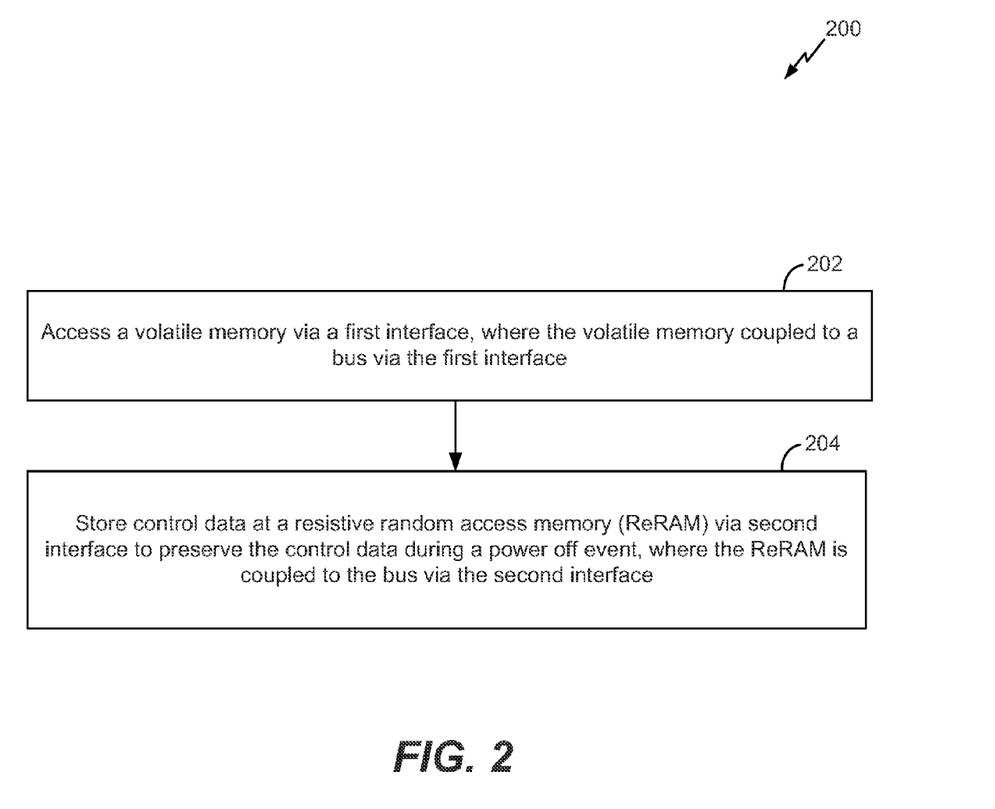
FIG. 2 is a flow diagram of an illustrative embodiment of a method to operate the data storage device of FIG. 1.

Referring to FIG. 2, an illustrative embodiment of a method 200 to enable use of a memory controller with resistive random access memory (ReRAM) is shown. For example, the method 200 may be performed by at a data storage device, such as the data storage device 102 (e.g., performed by the controller 120 and/or the processor 179) of FIG. 1. The memory controller may include or correspond to the controller 120 that includes the processor 179, the ReRAM 156, and the volatile memory 158 of FIG. 1.

The method 200 includes accessing the volatile memory via a first interface, where the volatile memory is coupled to a bus via the first interface, at 202. The first interface may include or correspond to a dedicated bus-to-volatile memory interface. For example, the volatile memory may include the volatile memory 158 that includes the dedicated bus-to-volatile memory interface 178. The bus may include or correspond to the bus 154 that is included in the controller 120 of FIG. 1. In a particular embodiment, accessing the volatile memory includes accessing logical-to-physical mapping data stored at the volatile memory. The logical-to-physical mapping data may be associated with (e.g., correspond to) one or more physical locations of a memory of the data storage device, such as the memory 104 of the data storage device 102 of FIG. 1. The memory may be coupled to the memory controller (e.g., a processor, such as the processor 179 of FIG. 1, included in the memory controller) via a dedicated controller-to-non-volatile memory interface and may be configured to store data, such as user data and/or control data, encoded data, or a combination thereof.

The method 200 further includes storing control data at the ReRAM via a second interface, where the ReRAM is coupled to the bus via the second interface, at 204. The second interface may include or correspond to a dedicated bus-to-ReRAM interface. For example, the ReRAM may include or correspond to the ReRAM 156 that includes the bus-to-ReRAM interface 176 of FIG. 1. The control data may include or correspond to the control data 177 of FIG. 1. The control data may be read from the volatile memory upon detection of a power event and written to the ReRAM to preserve the control data. Other control data may be stored in the ReRAM and may not be moved upon detection of the power event. Additionally, the ReRAM may be configured to store user data, such as user data received from a host device that is coupled to the data storage device.

The method 200 may enable data to be maintained at the memory controller data during a low-power event, such as a power off event. Thus, the data storage device may maintain the data in the event of a power loss without using capacitors to extend a write capability during the low-power event.

The method 200 of FIG. 2 may be initiated or controlled by an application-specific integrated circuit (ASIC), a processing unit, such as a central processing unit (CPU), a digital signal processor (DSP), a controller, another hardware device, a firmware device, a field-programmable gate array (FPGA) device, or any combination thereof. As an example, the method 200 of FIG. 2 can be initiated or controlled by one or more processors, such as one or more processors included in or coupled to a controller. A controller (e.g., a processor and/or control logic) configured to perform the method 200 of FIG. 2 may be able to store (e.g., maintain) data at ReRAM during a loss of power.

Figure 3:
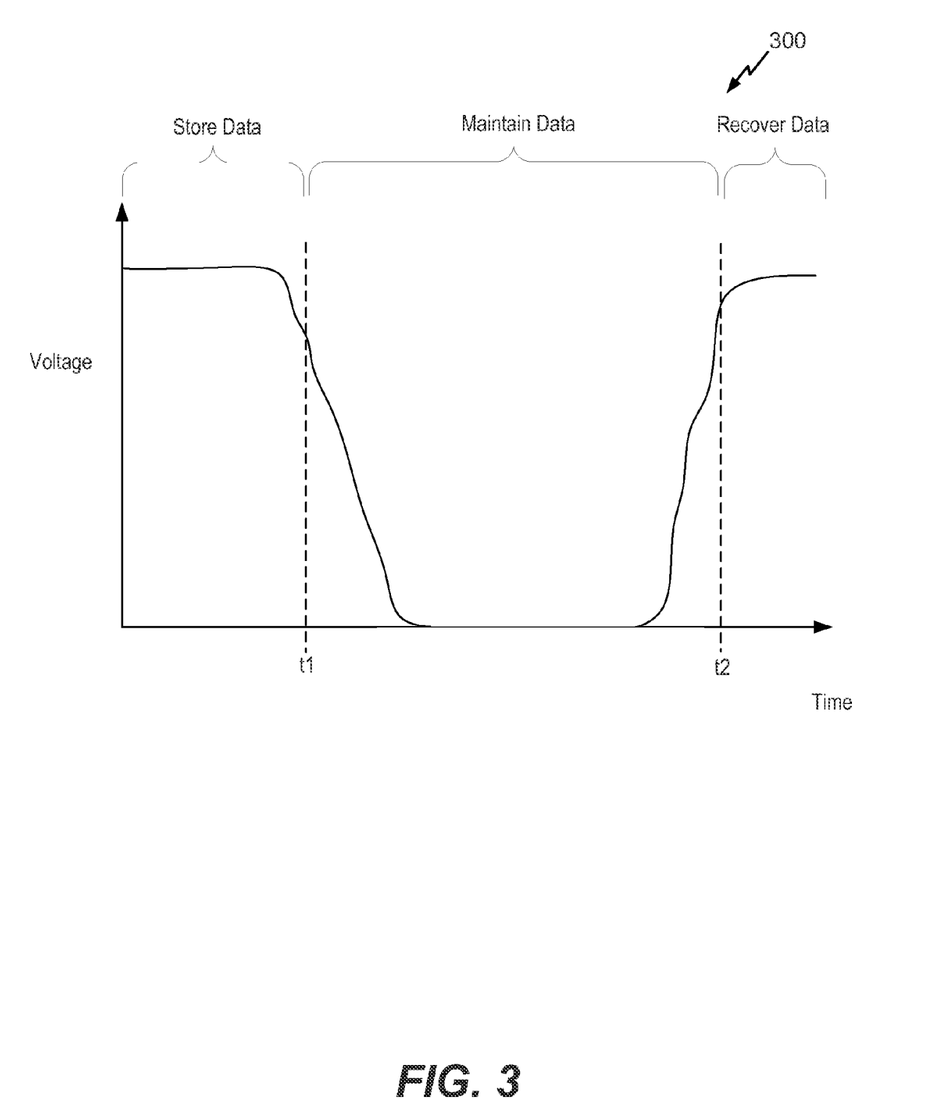
FIG. 3 is a graph of an illustrative example of voltage supplied to the data storage device of FIG. 1.

Referring to FIG. 3, a graph of a power event is illustrated and generally designated 300. For example, the graph 300 may illustrate voltage supplied to a data storage device, such as the data storage device 102, over a period of time. In a particular embodiment, the graph 300 illustrates voltage provided to a memory controller, such as the controller 120 of FIG. 1, over a period of time.

Prior to a first time (t1) the data storage device may receive sufficient voltage to operate the data storage device and data may be stored at a ReRAM of the memory controller of the data storage device. To illustrate, the data may include the control data 177 or the user data 132 of FIG. 1. The data may be stored to a ReRAM and/or a volatile memory included in or coupled to the memory controller. For example, the ReRAM, the volatile memory, and/or a processor of the memory controller may be included in the same die. The processor, the ReRAM and the volatile memory may include or correspond to the processor 179, the ReRAM 156 and the volatile memory 158 of FIG. 1, respectively.

At the first time (t1), the data storage device may experience a power event, such as a low-voltage condition. In a particular embodiment, the power event occurs after the data is written to the ReRAM.

During a time period between the first time (t1) and a second time (t2), the data may be maintained at the ReRAM. At the second time (t2), an operable voltage level may be received by the data storage device (e.g., the power event may end).

After the second time (t2), control logic (e.g., the processor 179 of FIG. 1 or other control logic included in the memory controller) may recover the data. For example, in response to a power on event (e.g. a power restoration event), the control logic may read the control data from the ReRAM. As another example, the data recovered from the ReRAM may include a copy of the user data to be written to a memory (e.g. a non-volatile memory, such as the memory 104 of FIG. 1) of the data storage device, metadata associated with the user data, logical-to-physical mapping data, block mapping data, processor variables, processor context data, or a combination thereof. Thus, by storing the data at the ReRAM, the ReRAM may advantageously be used to recover the data in the event of a loss of power.

Figure 4:
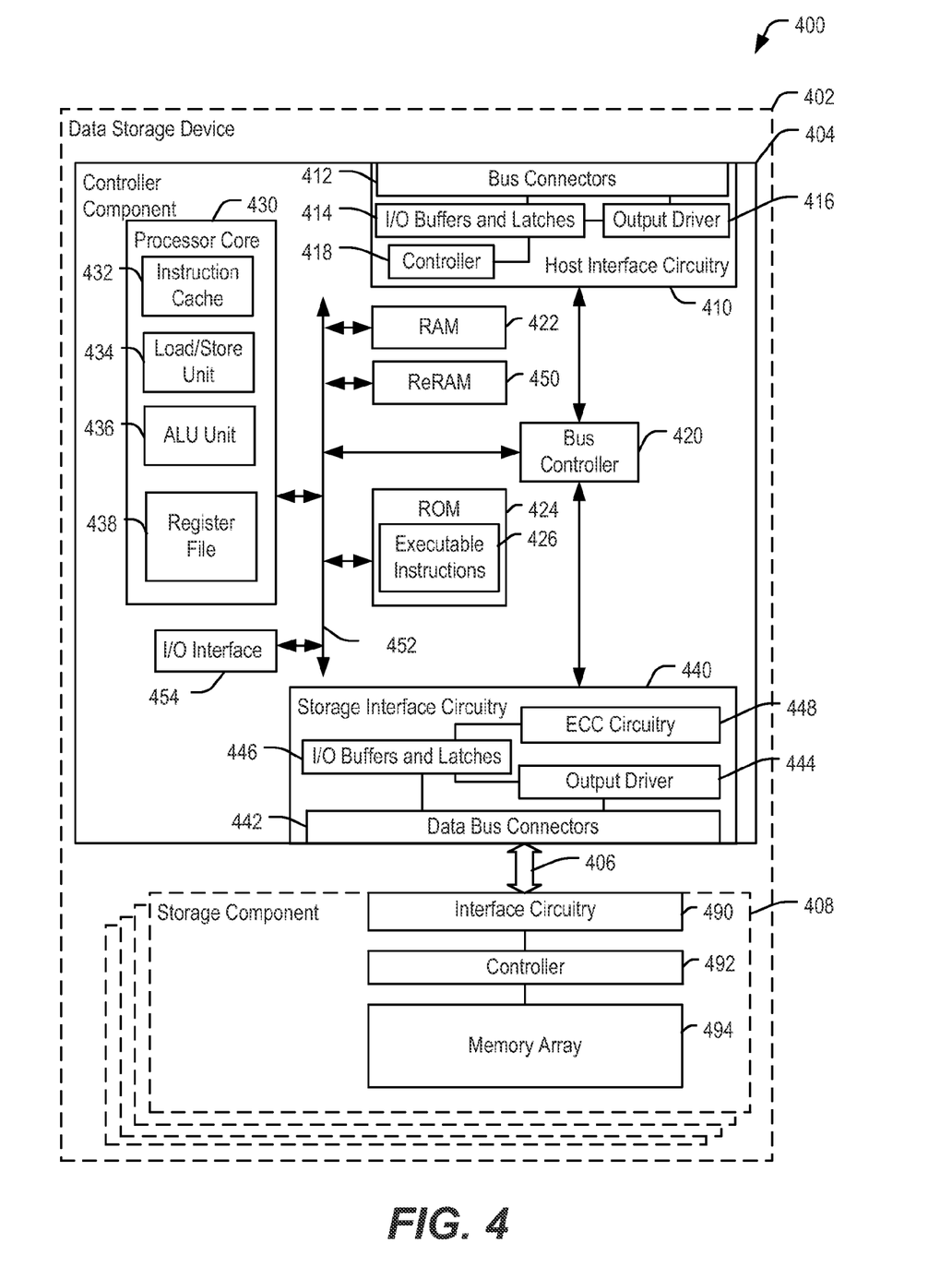
FIG. 4 is a block diagram of another illustrative system including a memory controller with ReRAM.

Referring to FIG. 4, an illustrative embodiment of a system including a data storage device is depicted and generally designated 400. The system 400 includes a data storage device 402 that includes a controller component 404 coupled to one or more storage components, such as a representative storage component 408, via a bus 406. The data storage device 402 may include or correspond to the data storage device 102 of FIG. 1. The bus 406 and the controller component 404 may include or correspond to the bus 106 and the controller 120 of FIG. 1, respectively.

The representative storage component 408 may include or correspond to the memory die 103 of FIG. 1. The representative storage component 408 includes interface circuitry 490 to communicate via the bus 406. For example, the interface circuitry 490 may include or correspond to the non-volatile memory-to-controller interface 144 of FIG. 1.

The storage component 408 also includes a controller 492 that is coupled to the interface circuitry 490 and that is also coupled to a memory, such as a memory array 494. The memory array 494 may include one or more types of storage media such as a NAND array or a ReRAM array. For example, the memory array 494 may include or correspond to the memory 104 of FIG. 1. In some embodiments, the memory array 494 may have a 2D configuration. In other embodiments, the memory array 494 may have a 3D configuration, as described further with reference to FIG. 7.

In a particular embodiment, the controller component 404 includes host interface circuitry 410 coupled to a bus controller 420, such as a direct memory access (DMA) bus controller. The controller component 404 also includes storage interface circuitry 440 that is coupled to the bus controller 420. For example, the host interface circuitry 410 may include or correspond to the host interface 108 of FIG. 1. The storage interface circuitry 440 may include or correspond to the controller-to-non-volatile memory interface 150.

In a particular embodiment, the host interface circuitry 410 includes bus connectors 412 coupled to input/output (I/O) buffers and latches 414. The bus connectors 412 are further coupled to output driver circuitry 416. The host interface circuitry 410 also includes a controller 418. In a particular embodiment, the host interface circuitry 410 operates in accordance with a universal serial bus (USB) protocol. For example, the controller 418 may be programmed to receive USB protocol instructions and data from a host device (not shown) via the bus connectors 412 that are coupled to a universal serial bus. The controller 418 may include a hardware processor that executes instructions stored at an internal memory, such as a read-only memory (not shown) to enable receipt and acknowledgment of USB instructions and data. Alternatively, or in addition, the host interface circuitry 410 may be configured to support other communication protocols, such as a Secure Digital (SD) protocol, a small computer system interface (SCSI), parallel interface (SPI), a Compact Flash (CF) protocol, one or more other protocols, or any combination thereof.

The controller component 404 may include a processor core 430, a random access memory (RAM) 422, a ReRAM 450, an input/output interface 454, and a read-only memory (ROM) 424. The processor core 430 may include or correspond to the processor 179 of FIG. 1. The RAM 422 and the ReRAM 450 may include or correspond to the RAM 158 and the ReRAM 156 of FIG. 1, respectively. In some embodiments the controller component 404 may include or be coupled to a dynamic random access memory (DRAM). For example, the DRAM may be on a distinct die from the controller component 404 (e.g., a different die than the processor core, the RAM 422, the ReRAM 450, and/or the ROM 424)

and the controller component 404 (e.g., the bus 452) may be coupled to the DRAM via the input/output interface 454. As another example, the DRAM may be included in the same die as the controller component 404 (e.g., on the same die as the processor core, the RAM 422, the ReRAM 45, and/or the ROM 424) and may be directly coupled to an internal bus 452. The processor core 430, the RAM 422, the ReRAM 450, the input/output interface 454, and the ROM 424 may be coupled to the bus controller 420 via the internal bus 452, such as the bus 154 of FIG. 1. In a particular embodiment, the processor core 430 includes an instruction cache 432, a load/store unit 434, an arithmetic logic unit (ALU) unit 426, and a register file 438. The processor core 430 may include, or may function substantially similarly to, an ARM core, as an illustrative, non-limiting example. For example, the processor core 430 may support a reduced instruction set computer (RISC) micro-architecture. The processor core 430 may be configured to retrieve data and executable instructions 426 via the load/store unit 434 from the read only memory 424.

The executable instructions 426 may include instructions to access (e.g., read from or write to) the RAM 422, instructions to access (e.g., read from or write to) the ReRAM 450, instructions to access (e.g., read from or write to) the memory array 494 of the storage component 408, instructions to access (e.g., read from or write to) a device via the input/output interface 454, instructions to determine a type of data, instructions to route the data based on the type of data, instructions to read control data from the ReRAM 450, or a combination thereof. For example, the processor core 430 may identify data generated at the controller component 404 or received at the controller component 404. The processor core 430 may determine a type of the data, such as a user data type or a control data type. The processor core 430 may route the data to the ReRAM 450, to the RAM 422 (e.g., a volatile memory), and/or to the memory array 494 based on the type of the data. To illustrate, the processor core 430 may route control data to the ReRAM 450 and may route user data to the RAM 422 and to the memory array 494.

Alternatively, or in addition, at least some of the executable instructions 426 may not be stored at the ROM 424 and may instead be stored at the memory array 494. The executable instructions 426 may be retrieved from the memory array 494 and stored at the RAM 422. The processor core 430 may be configured to retrieve the executable instructions 426 from the RAM 450 for execution.

The executable instructions 426 may be retrieved by the load/store unit 434 and stored to the instruction cache 432. The executable instructions stored at the instruction cache 432 may be scheduled and provided to one or more execution pipelines, such as an execution pipeline including the ALU unit 436. The ALU unit 436 may include dedicated circuitry to perform arithmetic and logic operations, such as addition and subtraction, AND, NOT, OR, exclusive-OR (XOR), other arithmetic or logic operations, or any combination thereof.

The register file 438 may include multiple memory cells that may provide high speed access to the processor core 430 of data to be used for execution of instructions. One or more memory cells at the register file 438 may be dedicated to store a status indicator. Additional data values, such as values to indicate memory type, memory write status, and write protect status, may also be set during execution of the executable instructions 426 at the processor core 430.

Thus, in a particular embodiment, the processor core 430 may be programmed to perform at least a portion of the method 200 of FIG. 2. For example, the processor core 430 may be programmed to access the RAM 422 (e.g., a volatile memory) via a dedicated bus-to-volatile memory interface, where the RAM 422 is coupled to the bus 452 via the dedicated bus-to-volatile memory interface. The processor core 430 may also be programmed to storing control data at the ReRAM 450 via a dedicated bus-to-ReRAM interface to preserve the control data during a low-power event, where the ReRAM 422 is coupled to the bus 452 via the dedicated bus-to-ReRAM interface.

The storage interface circuitry 440 may include data bus connectors 442, an output driver 444, input/output buffers and latches 446, and error correcting code (ECC) circuitry 448. The data bus connectors 442 may include electrical connectors to enable electrical signal propagation via the bus 406. The I/O buffers and latches 446 may be configured to store data that is received via the bus controller 420 to be transmitted via the bus 406 using electrical signals at the data bus connectors 442 that are generated by the output driver 444. In addition, or alternatively, the I/O buffers and latches 446 may store data values represented by electrical signals received at the data bus connectors 442 via the data bus 406, such as signals generated by the interface circuitry 490 of the storage component 408.

The error correction circuitry 448, such as the ECC engine 122 of FIG. 1, may include dedicated hardware and circuitry configured to perform operations (e.g., error detection operations and/or error correction operations) using data corresponding to the data that are received as a result of a memory read from the storage component 408. The storage interface circuitry 440 may include a flash memory interface, and the error correction circuitry 448 may be compliant with one or more flash error correcting code protocols.

Figure 5:
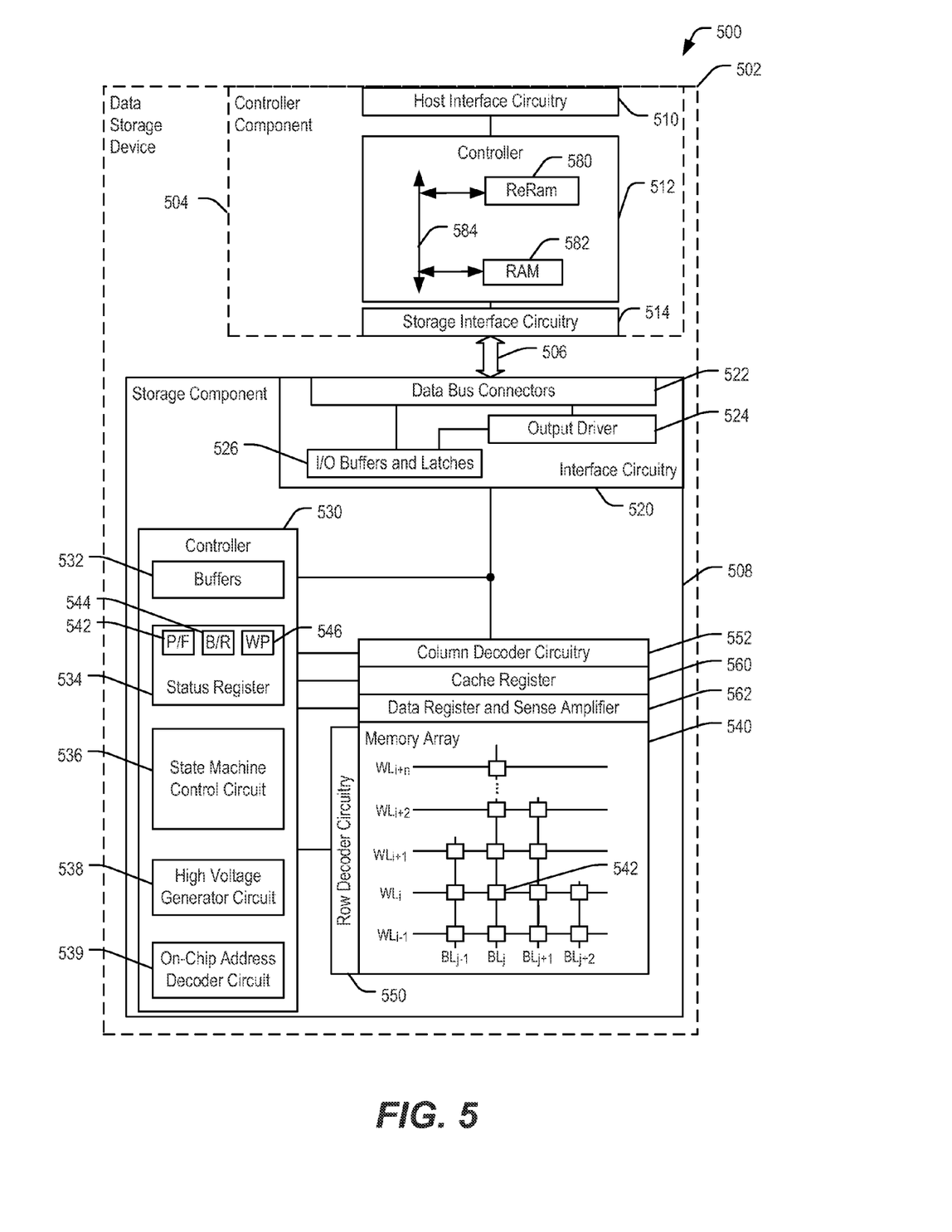
FIG. 5 is a block diagram of another illustrative system including a memory controller with ReRAM.

Referring to FIG. 5, an illustrative embodiment of a system including a data storage device is depicted and generally designated 500. The system 500 includes a data storage device 502 that includes a controller component 504 coupled to a storage component 508. The data storage device 502 may include or correspond to the data storage device 102 of FIG. 1 and/or the data storage device 402 of FIG. 4. The storage component 508 may include or correspond to the memory die 103 of FIG. 1 and/or the storage component 408 of FIG. 4.

The controller component 504 may include host interface circuitry 510, a controller 512, and storage interface circuitry 514. For example, the controller component 504 may include or correspond to the controller 120 of FIG. 1 and/or the controller component 404 (e.g., the processor core 430) of FIG. 4. The host interface circuitry 510 may include or correspond to the host interface 108 or to the host interface circuitry 410 of FIG. 4. The storage interface circuitry 514 may include or correspond to the controller-to-non-volatile memory interface 150 of FIG. 1 or the storage interface circuitry 440 of FIG. 4.

The controller component 504 may be coupled to the storage component 508 via a bus 506, such as an 8-bit or 16-bit parallel data bus, as an illustrative, non-limiting example. The bus 506 may include or correspond to the bus 106 of FIG. 1 or the bus 406 of FIG. 4. The controller component 504 may communicate instructions and data with an external host (not shown) via the host interface circuitry 510. The controller 512 may be configured to respond to instructions received by the host interface circuitry 510 and may also be configured to send and receive data and instructions to the storage component 508 via the storage interface circuitry 514.

The controller 512 may include a processor (not shown), a ReRAM 580, a RAM 582 and a bus 584. Each of the processor, the ReRAM 580 and the RAM 582 may be coupled to the bus 584. The processor may include or correspond to the processor 179 of FIG. 1 or the processor core 430 of FIG. 4. The ReRAM 580 may include or correspond to the ReRAM 156 of FIG. 1 or the ReRAM 450 of FIG. 4. The RAM 582 may include or correspond to the RAM 158 of FIG. 1 or the RAM 422 of FIG. 4. The bus 584 may include or correspond to the bus 154 of FIG. 1 or the bus 452 of FIG. 1.

In a particular embodiment, the storage component 508 includes interface circuitry 520, a controller 530 coupled to the interface circuitry 520, and a memory array 540 accessible to the controller 530. For example, the memory array 540 may include or correspond to the memory 104 of FIG. 1 or the memory array 494 of FIG. 4.

The memory array 540 may include multiple wordlines and multiple bit lines. For example, the memory array 540 may include a first wordline $WL_{i-1}$, a second wordline $WL_i$, a third wordline $WL_{i+1}$, a fourth wordline $WL_{i+2}$, and a fifth wordline $WL_{i+n}$. Although the memory array 540 is illustrated as having five wordlines, the memory array 540 may include more than five wordlines or fewer than five wordlines. As another example, the memory array 540 may include a first bit line $BL_{j-1}$, a second bit line $BL_j$, a third bit line $BL_{j+1}$, and a fourth bit line $BL_{j+2}$. Although the memory array 540 is illustrated as having four bit lines, the memory array may include more than four bit lines or fewer than four bit lines.

The storage component 508 may include row decoder circuitry 550 and column decoder circuitry 552 that enable access to data stored at one or more particular rows and particular columns of the memory array 540, such as to read a value from or to write a value to a particular memory cell 542 at a bit line $BL_j$ and at word line $WL_i$. A cache register 560 and a data register and sense amplifier 562 may further be coupled to the memory array 540 and may be used to cache or to temporarily store data that is to be written to the memory array 540 or data that has been read out of the memory array 540. In a particular embodiment, the memory array 540 may include a flash memory. In some embodiments, the memory array 540 may include a 3D memory, as described further with reference to FIG. 7.

In a particular embodiment, the controller 530 includes one or more buffers 532 to store instructions, data, or any combination thereof. The controller 530 may also include one or more status registers 534, a state machine control circuit 536, a high voltage generator circuit 538, and an on-chip address decoder circuit 539. The controller 530 may be coupled to provide electrical signals to the row decoder circuitry 550, to the column decoder circuitry 552, to the cache register 560, and to the data register and sense amplifier 562. In a particular embodiment, the status register 534 of the controller 530 may include one or more indicators storing values, such as a Pass/Fail (P/F) value 542, a Busy/Ready (B/R) value 544, a write protect (WP) value 546, one or more other indicators, or a combination thereof. The status register 534 may be accessible to the state machine control circuit 536.

The state machine control circuit 536 may include dedicated hardware and circuitry to control an operation of the controller 530 in response to one or more received instructions and internal states, such as may be represented at the status register 534. The state machine control circuit 536 may include states such as a read status state, a data write state, a data read state, as illustrative, non-limiting examples.

In a particular embodiment, the high voltage generator circuit 538 may be responsive to the state machine control circuit 536 and may be configured to generate a high voltage to program values to, or erase values from, the memory array 540. For example, the memory array 540 may be a flash memory or other memory that may be programmable or erasable via a "high" voltage, such as, for example, five volts (V). The controller 530 may also include the on-chip address decoder circuit 539 that may include hardware and logic circuitry to receive memory address information from the controller component 504 and to decode the memory address information to specific rows and columns to be provided to the row decoder circuitry 550 and the column decoder circuitry 552.

The interface circuitry 520 may include data bus connectors 522, an output driver 524 coupled to the data bus connectors 522, and input/output (I/O) buffers and latches 526. The interface circuitry 520 may include or correspond to the non-volatile memory-to-controller interface 144 of FIG. 1 or the interface circuitry 490 of FIG. 4. The I/O buffers and latches 526 may be configured to store or to latch data that is received via the data bus connectors 522 or data that is to be written to the data bus 506 via the data bus connectors 522. The data bus connectors 522 may include physical electrical connectors that couple the interface circuitry 520 to the data bus 506. The output driver 524 may include dedicated circuitry and electrical connections to enable the interface circuitry 520 to drive electrical signals over the bus 506. In a particular embodiment, the interface circuitry 520 is configured to comply with one or more bus communications protocols or standards.

In some embodiments, the storage component 508 may include or be coupled to a storage ReRAM (distinct from the ReRAM 580). The storage ReRAM may be coupled to the data bus connectors 522 and/or to the controller 530. For example, the storage ReRAM may replace an I/O buffer portion of the I/O buffers and latches 526 included in the interface circuitry 520. The storage ReRAM may be included in the same die as the controller 530 and/or the memory array 540. In other embodiment, the storage ReRAM may be on a separate die than the controller 530 and/or the memory array 540.

In a particular embodiment, the storage ReRAM and the memory array 540 (e.g., a non-volatile memory) may be coupled to the controller component 504 via the bus 506. The storage ReRAM may be coupled to the bus 506 via a bus-to-ReRAM interface and the memory array 540 may be coupled to the bus 506 via a set of one or more latches (e.g., latches corresponding to the I/O buffers and latches 526). The controller component 504 may send data to the storage component 508 via the bus 506 to be stored at the storage ReRAM and/or at the memory array 540. For example, the data may be provided to the set of latches to be stored at the memory array 540. Alternatively, or in addition, the data may also be provided to be stored at the storage ReRAM. An amount of time to store the data at the storage ReRAM (e.g. a write latency of the storage ReRAM) may be less than an amount of time to store the data at the memory array 540 using the set of data latches. The storage ReRAM may be used to maintain the data at the storage component 508 in the event of a power loss while the data is being written to the memory array 540. For example, if a loss of power occurs before all of the data is written to the memory array 540 from the set of latches, the data may be recovered from the storage ReRAM and written to the memory array 540 after power is restored. To illustrate, after a power restoration event, the controller 530 may initiate a read operation at the storage ReRAM to read the data and may initiate a write operation at the memory array 540 to write the data to the memory array 540.

Figure 6:
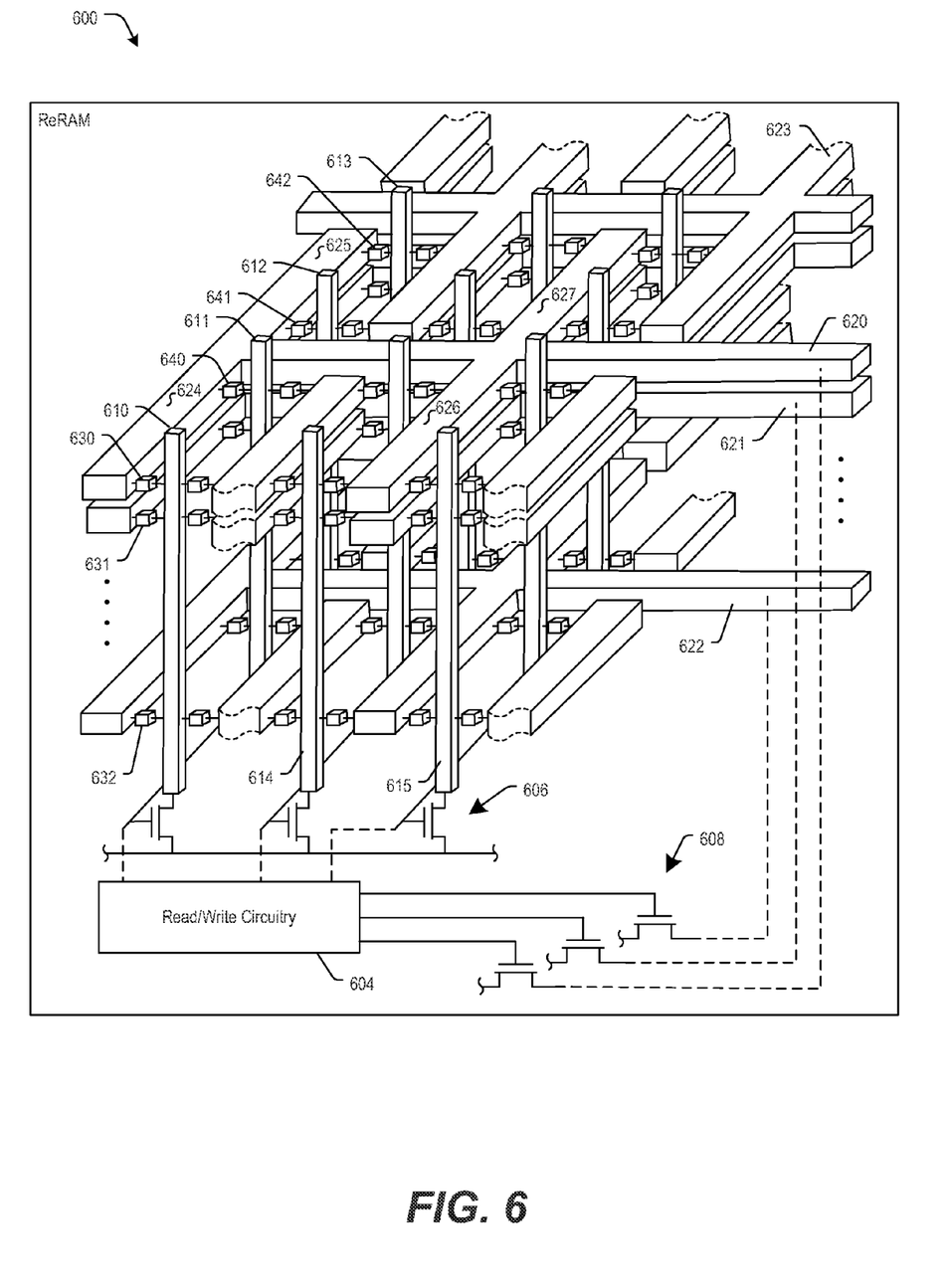
FIG. 6 is a block diagram of a particular embodiment of ReRAM.

FIG. 6 is a diagram of a particular embodiment of a memory 600. The memory 600 may be included in the data storage device 102 of FIG. 1, the data storage device 402 of FIG. 4, and/or the data storage device 502 of FIG. 5. FIG. 6 illustrates a portion of a three-dimensional architecture of the memory 600, such as a resistive random access memory (ReRAM). For example, the memory 600 may include the ReRAM 156 of FIG. 1, the ReRAM 450 of FIG. 4, and/or the ReRAM 580 of FIG. 5. In the embodiment illustrated in FIG. 6, the memory 600 (e.g., the ReRAM) includes a plurality of conductive lines in physical layers over a substrate (e.g., substantially parallel to a surface of the substrate), such as representative wordlines 620, 621, 622, and 623 (only a portion of which is shown in FIG. 6) and a plurality of vertical conductive lines through the physical layers, such as representative bit lines 610, 611, 612, and 613.

The memory 600 also includes a plurality of resistance-based storage elements (e.g., memory cells), such as representative storage elements 630, 631, 632, 640, 641, and 642, each of which is coupled to a bit line and a wordline in arrays of memory cells in multiple physical layers over the substrate (e.g., a silicon substrate). The memory 600 also includes read/write circuitry 604, such as the read circuitry 140 of FIG. 1, the write circuitry 142 of FIG. 1, or a combination thereof. The read/write circuitry 604 is coupled to wordline drivers 608 and bit line drivers 606.

In the embodiment illustrated in FIG. 6, each of the wordlines includes a plurality of fingers (e.g., a first wordline 620 includes fingers 624, 625, 626, and 627). Each finger may be coupled to more than one bit line. To illustrate, a first finger 624 of the first wordline 620 is coupled to a first bit line 610 via a first storage element 630 at a first end of the first finger 624 and is coupled to a second bit line 611 via a second storage element 640 at a second end of the first finger 624.

In the embodiment illustrated in FIG. 6, each bit line may be coupled to more than one wordline. To illustrate, the first bit line 610 is coupled to the first wordline 620 via the first storage element 630 and is coupled to a third wordline 622 via a third storage element 632.

During a write operation, the controller 120 (e.g., the processor 179) may generate data (e.g., control data) or may receive data (e.g., user data) from a host device, such as the host device 130 of FIG. 1. The controller 120 (e.g., the processor 179) may send the data (or a representation of the data) to the memory 600. For example, the controller 120 (e.g., the processor 179 and/or the ECC engine 122) may encode the data prior to sending the encoded data to the memory 600 via the bus 154 of FIG. 1.

The read/write circuitry 604 may write the data to storage elements corresponding to the destination of the data. For example, the read/write circuitry 604 may apply selection signals to selection control lines coupled to the wordline drivers 608 and the bit line drivers 606 to cause a write voltage to be applied across a selected storage element. For example, to select the first storage element 630, the read/write circuitry 604 may activate the wordline drivers 608 and the bit line drivers 606 to drive a programming current (also referred to as a write current) through the first storage element 630. To illustrate, a first write current may be used to write a first logical value (e.g., a value corresponding to a high-resistance state) to the first storage element 630, and a second write current may be used to write a second logical value (e.g., a value corresponding to a low-resistance state) to the first storage element 630. The programming current may be applied by generating a programming voltage across the first storage element 630 by applying a first voltage to the first bit line 610 and to wordlines other than the first wordline 620 and applying a second voltage to the first wordline 620. In a particular embodiment, the first voltage is applied to other bit lines (e.g., the bit lines 614, 615) to reduce leakage current in the memory 600.

Additionally, the controller 120 (e.g., the processor 179) may access the data stored at the memory 600. The controller 120 (e.g., the processor 179) may cause the read/write circuitry 604 to read bits from particular storage elements of the memory 600 by applying selection signals to selection control lines coupled to the wordline drivers 608 and the bit line drivers 606 to cause a read voltage to be applied across a selected storage element. For example, to select the first storage element 630, the read/write circuitry 604 may activate the wordline drivers 608 and the bit line drivers 606 to apply a first voltage (e.g., 0.7 volts (V)) to the first bit line 610 and to wordlines other than the first wordline 620. A lower voltage (e.g., 0 V) may be applied to the first wordline 620. Thus, a read voltage is applied across the first storage element 630, and a read current corresponding to the read voltage may be detected at a sense amplifier of the read/write circuitry 604. The read current corresponds (via Ohm's law) to a resistance state of the first storage element 630, which corresponds to a logical value stored at the first storage element 630. The logical value read from the first storage element 630 and other elements read during the read operation may be provided to the controller 120 (e.g., the processor 179).

Alternatively, a write operation and/or a read operation of the memory 600 may be initiated by the processor core 430 of FIG. 4 and/or the controller 512 of FIG. 5. A logical value read from the memory 600 may be provided to a non-volatile memory of the data storage device that includes the memory 600. For example, the logical value may be provided to the memory 104 via the set of latches 182 of FIG. 1, to the memory array 494 of FIG. 4, and/or to the memory array 540 of FIG. 5.

Figure 7:
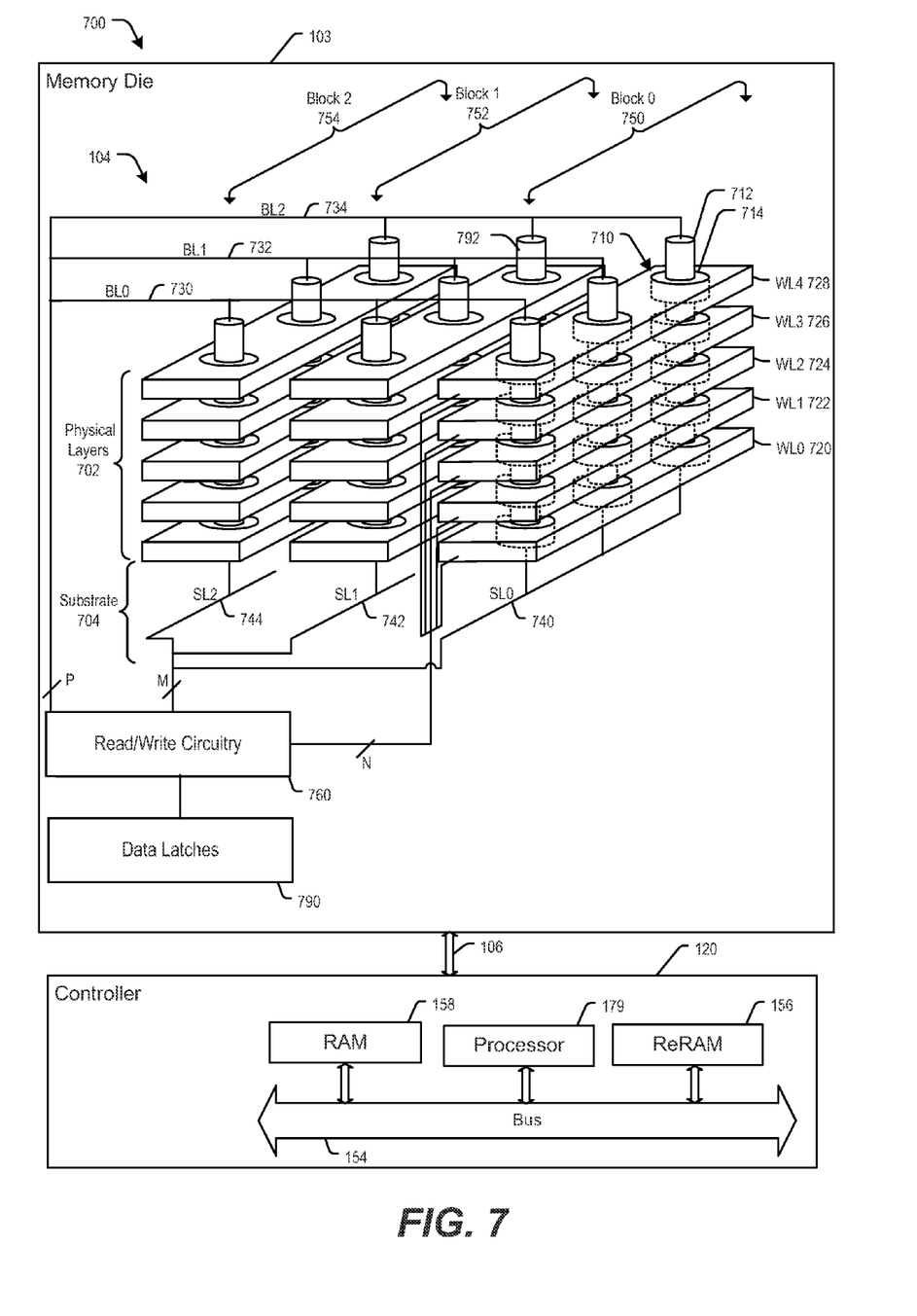
FIG. 7 is a block diagram of another illustrative system including a particular embodiment of the data storage device of FIG. 1, the data storage device of FIG. 4, and/or the data storage device of FIG. 5.

FIG. 7 illustrates an embodiment of a data storage device 700. The data storage device 700 may include or correspond to the data storage device 102 of FIG. 1, the data storage device 402 of FIG. 4, and/or the data storage device 502 of FIG. 5. The data storage device 700 may include the memory die 103 coupled to the controller 120 via the bus 106. The bus 106 may include or correspond to the bus 406 of FIG. 4 or the bus 506 of FIG. 5.

The controller 120 may include the processor 179, the RAM 158, the ReRAM 156, and the bus 154. The processor may include or correspond to the processor core 430 of FIG. 4. The bus 154 may include or correspond to the bus 452 of FIG. 4 and/or the bus 584 of FIG. 5. The ReRAM 156 may include or correspond to the ReRAM 450 of FIG. 4, the ReRAM 582 of FIG. 5, and/or the memory 600 of FIG. 6.

The data storage device 700 may include the memory 104 having a 3D NAND flash configuration. The memory 104 may include or correspond to the memory array 494 of FIG. 4 and/or to the memory array 540 of FIG. 5. The memory die 103 may also include read/write circuitry 760 and data latches 790. The data latches 790 may include or correspond to the latches 182 of FIG. 1.

The memory 104 includes multiple physical layers 702 that are monolithically formed above a substrate 704, such as a silicon substrate. Storage elements (e.g., memory cells), such as a representative memory cell 710, are arranged in arrays in the physical layers 702.

The representative memory cell 710 includes a charge trap structure 714 between a wordline/control gate (WL4) 728 and a conductive channel 712. Charge may be injected into or drained from the charge trap structure 714 via biasing of the conductive channel 712 relative to the wordline 728. For example, the charge trap structure 714 may include silicon nitride and may be separated from the wordline 728 and the conductive channel 712 by a gate dielectric, such as a silicon oxide. An amount of charge in the charge trap structure 714 affects an amount of current through the conductive channel 712 during a read operation of the memory cell 710 and indicates one or more bit values that are stored in the memory cell 710.

The memory 104 includes multiple erase blocks, including a first block (block 0) 750, a second block (block 1) 752, and a third block (block 2) 754. Each block 750-754 includes a "vertical slice" of the physical layers 702 that includes a stack of wordlines, illustrated as a first wordline (WL0) 720, a second wordline (WL1) 722, a third wordline (WL2) 724, a fourth wordline (WL3) 726, and the fifth wordline (WL4) 728. Multiple conductive channels (having a substantially vertical orientation with respect to FIG. 7) extend through the stack of wordlines. Each conductive channel is coupled to a storage element in each wordline 720-728, forming a NAND string of storage elements. FIG. 7 illustrates three blocks 750-754, five wordlines 720-728 in each block, and three conductive channels in each block for clarity of illustration. However, the memory 104 may have more than three blocks, more than five wordlines per block, and more than three conductive channels per block.

The read/write circuitry 760 is coupled to the conductive channels via multiple conductive lines, illustrated as a first bit line (BL0) 730, a second bit line (BL1) 732, and a third bit line (BL2) 734 at a "top" end of the conducive channels (e.g., farther from the substrate 704) and a first source line (SL0) 740, a second source line (SL1) 742, and a third source line (SL2) 744 at a "bottom" end of the conductive channels (e.g., nearer to or within the substrate 704). The read/write circuitry 760 is illustrated as coupled to the bit lines 730-734 via "P" control lines, coupled to the source lines 740-744 via "M" control lines, and coupled to the wordlines 720-728 via "N" control lines. Each of P, M, and N may have a positive integer value based on the specific configuration of the memory 104. In the illustrative example of FIG. 7, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 792 and a particular source line may be coupled to the top of the conductive channel 712. The bottom of the conductive channel 792 may be coupled (e.g., electrically coupled) to the bottom of the conductive channel 712. Accordingly, the conductive channel 792 and the conductive channel 712 may be coupled in series and may be coupled to the particular bit line and the particular source line.

The read/write circuitry 760 may operate as described with respect to the read circuitry 140 of FIG. 1, the write circuitry 142 of FIG. 1, or a combination thereof. For example, data may be stored to storage elements coupled to the wordline 728 and the read/write circuitry 760 may read bit values from the storage elements. As another example, the read/write circuitry 760 may apply selection signals to control lines coupled to the wordlines 720-728, the bit lines 730-734, and the source lines 740-742 to cause a programming voltage (e.g., a voltage pulse or series of voltage pulses) to be applied across selected storage element(s) of the selected wordline (e.g., the fourth wordline 728).

During a read operation, the controller 120 may receive a request from a host device, such as the host device 130 of FIG. 1. The controller 120 (e.g., the processor 179) may cause the read/write circuitry 760 to read bits from particular storage elements of the memory 104 by applying appropriate signals to the control lines to cause storage elements of a selected wordline to be sensed. Accordingly, the memory 104 may be configured to read from and write data to one or more storage elements.

Although various components of the data storage device 102 and the host device 130 of FIG. 1, the data storage device 402 of FIG. 2, the data storage device 502 of FIG. 5, the memory 600 of FIG. 6, and the data storage device 700 of FIG. 7, are depicted herein are illustrated as block components and described in general terms, such components may include one or more microprocessors, state machines, or other circuits configured to enable the various components to perform operations described herein. One or more aspects of the various components may be implemented using a microprocessor or microcontroller programmed to perform operations described herein, such as one or more operations of method 200 of FIG. 2. In a particular embodiment, the controller 120, the processor 179, the memory die 103 (e.g., the read circuitry 140 and/or the write circuitry 142) of FIG. 1 or FIG. 7, the processor core 430, the bus controller 420, the interface circuitry 490, the controller 492 of FIG. 4, the controller 512, the interface circuitry 520, and/or the controller 530 of FIG. 5, includes a processor executing instructions that are stored at a memory, such as a non-volatile memory of the data storage device 102 or the host device 130. Alternatively or additionally, executable instructions that are executed by the processor may be stored at a separate memory location that is not part of the non-volatile memory, such as at a read-only memory (ROM) of the data storage device 102 or the host device 130 of FIG. 1, the data storage device 402 of FIG. 4, the data storage device 502 of FIG. 5, or the data storage device 700 of FIG. 7.

In an illustrative example, the processor may execute the instructions to access a volatile memory via a dedicated bus-to-volatile memory interface, where the volatile memory is coupled to a bus via the dedicated bus-to-volatile memory interface. The instructions to access the volatile memory may include instructions to initiate a write operation at the volatile memory, instructions to initiate a read operation at the volatile memory, instructions to copy data stored at the volatile memory, instructions to identify a type of data, and/or instructions to access the volatile memory based on the type of data, as illustrative, non-limiting examples. The processor may execute instructions to store control data at the ReRAM via a dedicated bus-to-ReRAM interface to preserve the control data during a low-power event, where the ReRAM is coupled to the bus via the dedicated bus-to-ReRAM interface. The instructions to store the control data may include instructions to initiate a write operation at the ReRAM, instructions to instructions to identify a type of data to be stored at the ReRAM, and/or instructions to access the ReRAM based on the type of data, as illustrative, non-limiting examples.

Semiconductor memory devices, such as the memory 104, the ReRAM 156, the RAM 158 of FIG. 1 of FIG. 7, the memory array 494, the ReRAM 450, the RAM 422, the ROM 424 of FIG. 4, the memory array 540, the ReRAM 580, the RAM 582 of FIG. 5, or the memory 600 of FIG. 6, include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., in a NOR memory array. NAND and NOR memory configurations described have been presented as examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor material, such as silicon.

The memory elements may be arranged in the single memory device level in an ordered array, such as in a plurality of rows and/or columns. However, the memory elements may be arranged in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements arranged on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material, such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. To illustrate, each of the memory device levels may have a corresponding substrate thinned or removed before stacking the memory device levels to form memory arrays. Because each of the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

In some implementations, the memory 104, the ReRAM 156, the RAM 158 of FIG. 1 or FIG. 7, the memory array 494, the ReRAM 450, the RAM 422, the ROM 424 of FIG. 4, the memory array 540, the ReRAM 580, the RAM 582 of FIG. 5, or the memory 600 of FIG. 6 is a non-volatile memory having a three-dimensional (3D) memory configuration that is monolithically formed in one or more physical levels of arrays of memory cells having an active area disposed above a silicon substrate. The active area of a memory cell may be an area of the memory cell that is conductively throttled by a charge trap portion of the memory cell. The data storage device 102 and/or the host device 130 of FIG. 1, the data storage device 402 of FIG. 2, the data storage device 502 of FIG. 2, the memory 600 of FIG. 6, and/or the data storage device 700 of FIG. 7 may include circuitry, such as read/write circuitry, as an illustrative, non-limiting example, associated with operation of the memory cells.

Associated circuitry is typically used for operation of the memory elements and for communication with the memory elements. As non-limiting examples, memory devices may have circuitry for controlling and driving memory elements to perform functions such as programming and reading. The associated circuitry may be on the same substrate as the memory elements and/or on a separate substrate. For example, a controller for memory read-write operations may be located on a separate controller chip and/or on the same substrate as the memory elements One of skill in the art will recognize that this disclosure is not limited to the two dimensional and three dimensional structures described but cover all relevant memory structures within the spirit and scope of the disclosure as described herein and as understood by one of skill in the art.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
in a data storage device that includes a non-volatile memory and a controller coupled to the non-volatile memory, the controller including a bus and a processor coupled to the bus, wherein the data storage device further includes a volatile memory having a first interface and a resistive random access memory (ReRAM) having a second interface, wherein the controller is configured to store user data at the non-volatile memory via a controller-to-non-volatile memory interface, performing:
accessing the volatile memory via the first interface, wherein the volatile memory is coupled to the bus via the first interface;
storing data at the ReRAM via the second interface prior to a low-power event; and
retrieving the data from the ReRAM via the second interface after a power restoration event,
wherein the ReRAM is coupled to the bus via the second interface.

2. The method of claim 1, wherein storing the data at the ReRAM enables the data to be preserved during the low-power event, wherein the first interface is a dedicated bus-to-volatile memory interface, and wherein the second interface is a dedicated bus-to-ReRAM interface.

3. The method of claim 1, wherein the data includes a copy of the user data, metadata associated with the user data, logical-to-physical mapping data, block mapping data, processor variables, processor context data, or a combination thereof.

4. The method of claim 1, further comprising:
receiving the user data from a host device coupled to the data storage device;
generating a copy of the user data, wherein the copy of the user data corresponds to the data; and
sending the user data to the non-volatile memory via the controller-to-non-volatile memory interface.

5. The method of claim 1, further comprising, in response to a power on event, reading the data from the ReRAM.

6. The method of claim 1, wherein accessing the volatile memory includes accessing logical-to-physical mapping data stored at the volatile memory, wherein the logical-to-physical mapping data is associated with the non-volatile memory.

7. The method of claim 1, wherein the processor is configured to initiate access to the volatile memory, to initiate access to the ReRAM, to initiate access to the non-volatile memory, or a combination thereof.

8. The method of claim 1, wherein the controller determines whether to route the data to the ReRAM or to the volatile memory based on a type of the data.

9. The method of claim 1, wherein the volatile memory is accessed to generate a copy of at least a portion of the volatile memory, and wherein the data corresponds to the copy.

10. The method of claim 1, wherein the low-power event corresponds to a power off event.

11. The method of claim 1, wherein the ReRAM maintains the data at least during a time period beginning at a first time of the low-power event and ending at a second time of the power restoration event.

12. The method of claim 1, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

13. A data storage device comprising:
a non-volatile memory;
a controller coupled to the non-volatile memory and including a bus and a processor coupled to the bus;
a volatile memory coupled to the bus, wherein the volatile memory includes a first interface; and
a resistive random access memory (ReRAM) coupled to the bus, wherein the ReRAM includes a second interface,
wherein the processor is configured to store data at the ReRAM via the second interface to preserve the data during a power off event.

14. The data storage device of claim 13, wherein the first interface is a dedicated bus-to-volatile memory interface, and wherein the second interface is a dedicated bus-to-ReRAM interface.

15. The data storage device of claim 13, wherein the controller is configured to store user data at the non-volatile memory via a dedicated controller-to-non-volatile memory interface.

16. The data storage device of claim 13, wherein the processor is configured to access the volatile memory via the first interface.

17. The data storage device of claim 13, wherein the processor and the ReRAM are included in same die.

18. The data storage device of claim 13, wherein the processor and the ReRAM are on separate dies in a same package.

19. The data storage device of claim 13, wherein the second interface includes a bit accessible interface or a block accessible interface.

20. The data storage device of claim 13, wherein the second interface includes a parallel interface or a serial interface.

21. The data storage device of claim 20, wherein the controller is coupled to a dynamic random access memory (DRAM) on a separate die than the controller, and wherein the DRAM is coupled to the bus via an input/output interface of the controller.

22. The data storage device of claim 13, further comprising a voltage detector configured to monitor a supply voltage to the controller.

23. The data storage device of claim 13, wherein the non-volatile memory includes a three-dimensional (3D) memory configuration that is monolithically formed in one or more physical levels of arrays of memory cells having an active area disposed above a silicon substrate, and further comprising circuitry associated with operation of the memory cells.

24. A data storage device comprising:
- a non-volatile memory;
- a controller coupled to the non-volatile memory and including a bus and a processor coupled to the bus;
- a volatile memory coupled to the bus, wherein the volatile memory includes a first interface; and
- a resistive random access memory (ReRAM) coupled to the bus, wherein the ReRAM includes a second interface,
- wherein the non-volatile memory includes a three-dimensional (3D) memory configuration that is monolithically formed in one or more physical levels of arrays of memory cells having an active area disposed above a silicon substrate, and further comprising circuitry associated with operation of the memory cells.

25. The data storage device of claim 24, wherein the controller is coupled to a dynamic random access memory (DRAM) on a separate die than the controller, and wherein the DRAM is coupled to the bus via an input/output interface of the controller.

* * * * *